United States Patent [19]

Ramakrishnan et al.

[11] Patent Number: 5,192,871
[45] Date of Patent: Mar. 9, 1993

[54] VOLTAGE VARIABLE CAPACITOR HAVING AMORPHOUS DIELECTRIC FILM

[75] Inventors: E. S. Ramakrishnan; Kenneth D. Cornett; Wei-Yean Howng, all of Albuquerque, N. Mex.

[73] Assignee: Motorola, Inc., Schaumburg, Ill.

[21] Appl. No.: 776,034

[22] Filed: Oct. 15, 1991

[51] Int. Cl.$^5$ .............................................. H01L 29/92
[52] U.S. Cl. ................................ 257/595; 257/2; 257/52; 257/646; 331/177 V; 361/277
[58] Field of Search ............... 357/2, 14, 49, 51, 59 B, 357/59 G; 331/108 D, 116 R, 116 FE, 158, 177 V; 361/280, 277, 278, 281

[56] References Cited

U.S. PATENT DOCUMENTS

| | | |
|---|---|---|
| 3,579,278 | 5/1971 | Heer ........................................ 357/14 |
| 3,604,990 | 9/1971 | Sigsbee .................................... 357/14 |
| 3,611,070 | 10/1971 | Engeler ................................... 357/14 |
| 3,624,895 | 12/1971 | MacIver et al. ....................... 357/14 |
| 3,634,738 | 1/1972 | Leith et al. ............................. 357/14 |
| 3,860,945 | 1/1975 | Dawson ................................... 357/14 |
| 4,973,922 | 11/1990 | Embree et al. ................. 331/108 D |

FOREIGN PATENT DOCUMENTS

| | | |
|---|---|---|
| 62-128167 | 6/1987 | Japan ..................................... 357/14 |
| 1-280347 | 11/1989 | Japan ..................................... 357/14 |
| 2-60157 | 2/1990 | Japan ..................................... 357/14 |

*Primary Examiner*—Rolf Hille
*Assistant Examiner*—Minhloan Tran
*Attorney, Agent, or Firm*—Dale W. Dorinski

[57] ABSTRACT

A semiconductor device (10), comprising a semiconductor substrate (12) having a layer of semiconductor material (14) deposited, coated or grown epitaxially as a single crystal or polysilicon on the surface of the substrate. The layer of material is also a semiconductor material, having a higher resistivity than the substrate it is deposited on. A dielectric layer (16) of a metal oxide is formed on the high resistivity layer (14), which is then covered with an amorphous layer (18) of a metal oxide dielectric. Zirconium titanate may be used as a metal oxide dielectric layer. A metal electrode (20) is formed on the amorphous layer (18) to form a Metal Insulator Semiconductor device. In an alternative configuration, the amorphous layer (18) may instead be placed between the high resistivity layer (14) and the dielectric layer (16), or a second amorphous layer (22) may be added between the high resistivity layer and the dielectric layer. When the device is electrically energized, a depletion region is formed in the high resistivity layer, creating a voltage variable capacitor.

25 Claims, 2 Drawing Sheets

VOLTAGE VARIABLE CAPACITOR HAVING AMORPHOUS DIELECTRIC FILM

TECHNICAL FIELD

This invention relates generally to dielectric thin films and more specifically to dielectric thin films useful in capacitor applications.

BACKGROUND

High-quality, precisely-controlled capacitors are an integral part of many semiconductor devices. Capacitors are fabricated as part of a semiconductor circuit using Metal-Oxide-Silicon (MOS) technology or Metal-Insulator-Silicon (MIS) technology. One particular example of a semiconductor capacitor is in an application for an integrated circuit whose function is the conversion of analog signals to digital signals. In this circuit a series of capacitors are formed by placing an oxide, such as silicon oxide, over the semiconductor substrate and then fabricating an electrode over the oxide in order to form the capacitor.

Much effort has been spent in attempting to increase the capacitance of capacitors in semiconductor networks. In developing thin film capacitors, properties such as dielectric constant, loss factor, mechanical Q factor, resistivity, leakage current, breakdown field, and charge storage are extremely important. Improvement of these properties is critical in applications such as voltage variable capacitors (varactors) and bypass capacitors that are typically used in microwave and semiconductor device applications. Generally, crystalline films are used to manufacture these capacitors. One of the problems encountered in crystalline films is that the electrical conductivity may be enhanced by the increased electric field at crystal lattice boundaries or at the film-electrode contact interfaces, resulting in breakdown at a much lower voltage. In the area where the top electrode contacts the dielectric insulator, film defects or voids, and spaces between the grain boundaries will result in an increased loss factor (tangent delta). This also has the effect of lowering the breakdown field and charge storage.

Since crystalline films possess the sought-after high dielectric constant, it would be highly advantageous to develop a capacitor system that could employ a crystalline film and avoid the negative problems inherent due to the structure of crystalline films.

SUMMARY OF THE INVENTION

Briefly, according to the invention, a semiconductor device is provided, comprising a semiconductor substrate having a layer of semiconductor material deposited on the surface of the substrate. The layer of material is also a semiconductor material, having a higher resistivity than the substrate it is deposited on. A dielectric layer of a metal oxide is formed on the high resistivity layer, which is then covered with an amorphous layer of a metal oxide dielectric. A metal electrode is formed on the amorphous layer to form a metal insulator semiconductor device.

In an alternate embodiment of the invention, the amorphous layer may instead be placed between the high resistivity layer and the dielectric layer. A further embodiment of the invention incorporates a second amorphous layer added between the high resistivity layer and the dielectric layer.

DETAILED DESCRIPTION OF THE PREFERRED EMBODIMENT

A voltage variable capacitor, also known as a varactor, variable capacitance diode, or varacap, is a semiconductor device characterized by voltage sensitive capacitance which resides in the space-charge region at the surface of a semiconductor bounded by an insulating layer. In order to form a high performance voltage variable capacitor, a dielectric film having a very thin cross section and an extremely high integrity is required to be deposited on the semiconductor.

Figure 1:
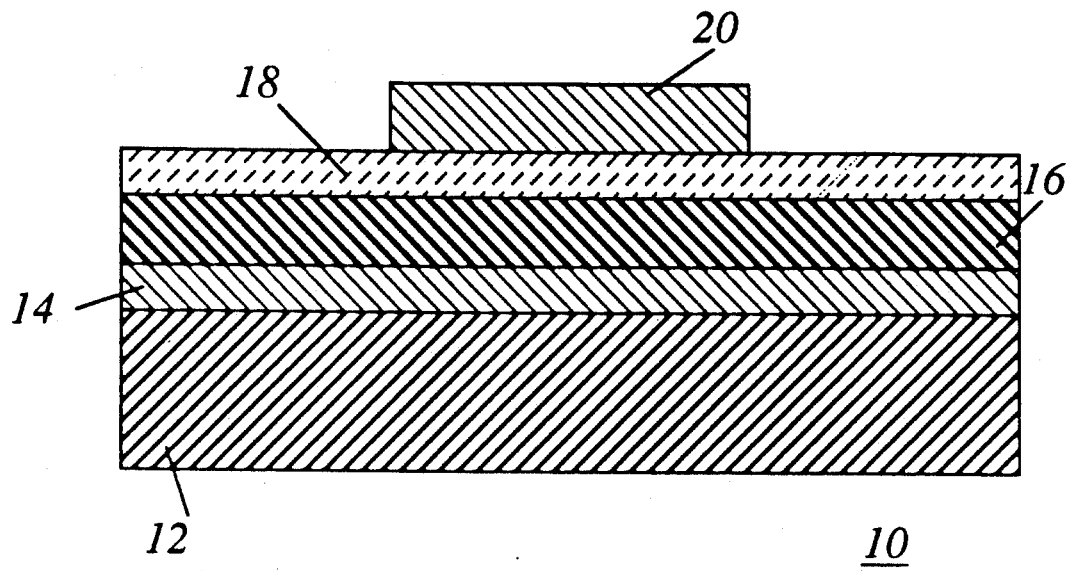
FIG. 1 is a cross-sectional view of a semiconductor device made in accordance with the invention.

Referring now to FIG. 1, a voltage variable capacitor 10 is formed on a semiconductor substrate 12. The substrate 12 also contains an epitaxial layer 14 on the surface of the substrate. The epitaxial layer may be grown as a single crystal, as polysilicon, or other means known to those skilled in the art. On top of this layer, an insulating layer 16 of a dielectric material is deposited. In order to form voltage variable capacitors having the highest performance, the dielectric layer 16 must be formed so as to have the highest possible dielectric constant. Typically, crystalline films of dielectric materials have higher dielectric constants than amorphous or partially crystalline films of the same material. Therefore, it is desirable to form the insulator layer 16 in a crystalline form. However, crystalline materials also suffer from defects in the crystal lattice and spaces in the grain boundaries between the crystallite structures. These defects and grain boundaries provide sites for inclusion or migration of foreign materials that may be conductive or alter the dielectric constant of the insulating layer 16. In order to obviate the inclusion of foreign materials in the dielectric layer 16, a second layer 18 of a film having the same or different chemical structure as the insulating layer 16, is applied on top of the insulating layer. The second layer 18 is applied such that the structure will be an amorphous material as opposed to a crystalline material. Amorphous materials have a more uniform, defect-free structure that prevents penetration of conductive foreign materials into the film. Amorphous films also do not suffer from the previously noted problems of crystal lattice defects and grain boundaries since they are non-crystalline films. Typically, in order to form an amorphous layer of the same material, the film is deposited at a lower temperature. The preferred method is to deposit the amorphous and crystalline layers in a vacuum system through processes such as chemical vapor deposition, evaporation, sputtering, or reactive sputtering. The second or amorphous layer may be formed using silicon dioxide or it may use the same material as employed in the insulating layer 16. A top electrode 20 is now formed on the amorphous film and delineated in order to create the voltage variable capacitor. The uniform, defect-free amorphous layer 18 now prevents direct conductivity between the electrode 20 and the epitaxial layer 14 through the crystalline insulating layer 16.

Another advantage of using the amorphous layer 18 as a type of seal coating over the insulating layer 16, is that in integrated circuit production technology, the integrated circuit wafer undergoes thermal treatments after the metallization step. These treatments may be as high in temperature as 400° C. Thermal treatments aggravate the penetration of impurities into the dielectric films by causing metal migration and possibly short circuiting the device. Other applications in semiconductor processing utilize polyimide coatings that are cured at high temperatures, typically as high as 250° C. These elevated temperatures also serve to aggravate the infusion of foreign materials into the insulating layer. The addition of a thin amorphous layer of dielectric material will prevent contamination or defect formation during the above processing steps, ensuring the ultimate film quality. This layer will improve the dielectric breakdown as well as acting as an effective diffusion barrier for the top metal electrode.

Figure 2:
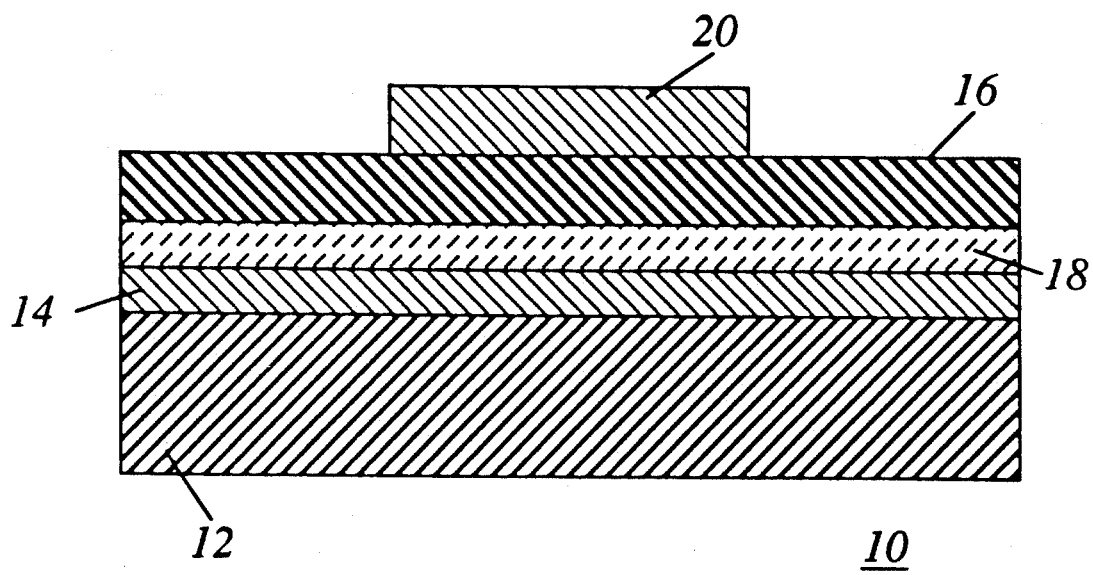
FIG. 2 is a cross-sectional view of an alternate embodiment of a device made in accordance with the invention.

Referring now to FIG. 2, another embodiment of the invention is to deposit the thin, amorphous film 18 over the substrate prior to deposition of the crystalline film 16. Such a structure prevents migration of impurities from the semiconductor 12 or epitaxial layer 14 into the crystalline film 16 by providing an amorphous film seal 18 on the bottom side of the crystalline film.

Figure 3:
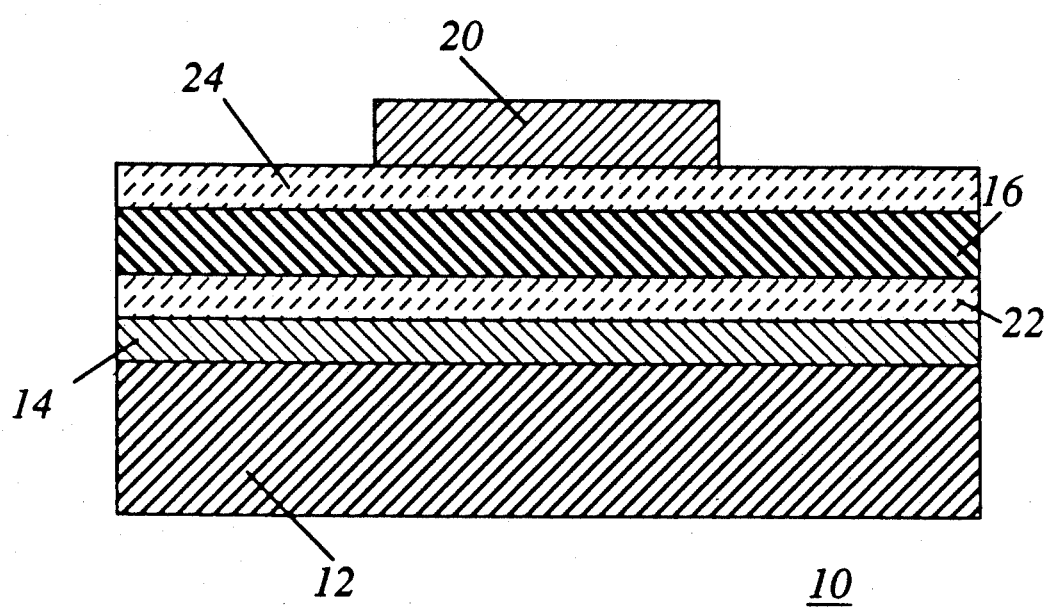
FIG. 3 is a cross-sectional view of another embodiment of a device made in accordance with the invention.

Referring now to FIG. 3, still another embodiment of the invention is to deposit a thin amorphous film 22 over the substrate prior to deposition of the crystalline film 16, followed by a top layer 24 of a second amorphous film. Such a structure prevents migration of impurities from the semiconductor 12 or epitaxial layer 14 into the crystalline film 16 by providing thin amorphous films (22 and 24) on both the top and the bottom sides of the crystalline film. Contamination of the crystalline film is prevented from both directions, that is, from the metal electrode 20 and from the semiconductor (12 and 14) layers.

The insulator layer 16 is preferably zirconium titanate (ZrTiO$_4$) applied in a thickness from 300 Ångstroms to 1000 Ångstroms. However, thicknesses from 100 Ångstroms to 2 microns may also be used to fabricate suitable devices. The material employed as the dielectric or insulating layer should have a dielectric constant much greater than that of the semiconductor in order to form a varactor having a wide range of values. Examples of suitable materials which may be used for this purpose are to be found in TABLE 1 below:

TABLE 1

| | |
|---|---|
| tantalum pentoxide | Ta$_2$O$_5$ |
| niobium pentoxide | Nb$_2$O$_5$ |
| zirconium oxide | ZrO$_2$ |
| titanium dioxide | TiO$_2$ |
| zirconium titanate | ZrTiO$_4$ |
| strontium titanate | SrTiO$_3$ |
| barium titanate | BaTiO$_3$ |
| lead titanate | PbTiO$_3$ |
| barium tetratitanate | Ba$_2$Ti$_9$O$_{20}$ |
| barium neodymium titante | BaNd$_2$Ti$_5$O$_{14}$ |
| lead-zirconium titanate | Pb(Zr,Ti)O$_3$ |
| lead-lanthanum zirconium titanate | (Pb,La)(Zr,Ti)O$_3$ |
| lithium niobate | LiNbO$_3$ |
| strontium-barium niobate | (Sr,Ba)Nb$_2$O$_6$ |

Although these materials will serve to form a voltage variable capacitor having a wide capacitance-voltage range, other materials having lower dielectric constants (such as silicon dioxide) may be used to create the structure. The theory of operation and use of the above materials in a voltage variable capacitor is shown, for example, in U.S. patent application entitled "Voltage Variable Capacitor" patent application Ser. No. 776,111, filed Oct. 15, 1991, by Cornett, et al, filed concurrently herewith, the disclosure of which is incorporated herein by reference.

Thin films of these materials can be formed by any of several techniques including, but not necessarily limited to, sputtering, evaporation, chemical vapor deposition, ion beam or plasma-enhanced processes and sol gel or other solution chemistry processes. The proposed amorphous layer or layers may also be deposited in similar means, only the deposition conditions must be modified in order that the film is deposited in an amorphous state as opposed to a crystalline state. The same materials may be used throughout, or the bottom material 22 may be different than the insulating layer 16, or a third material for the top layer 24 may be utilized. In each case, the amorphous film should be as thin as possible in order to prevent degradation of the capacitor performance since the dielectric constant of the amorphous film is somewhat less than that of the crystalline film.

Figure 4:
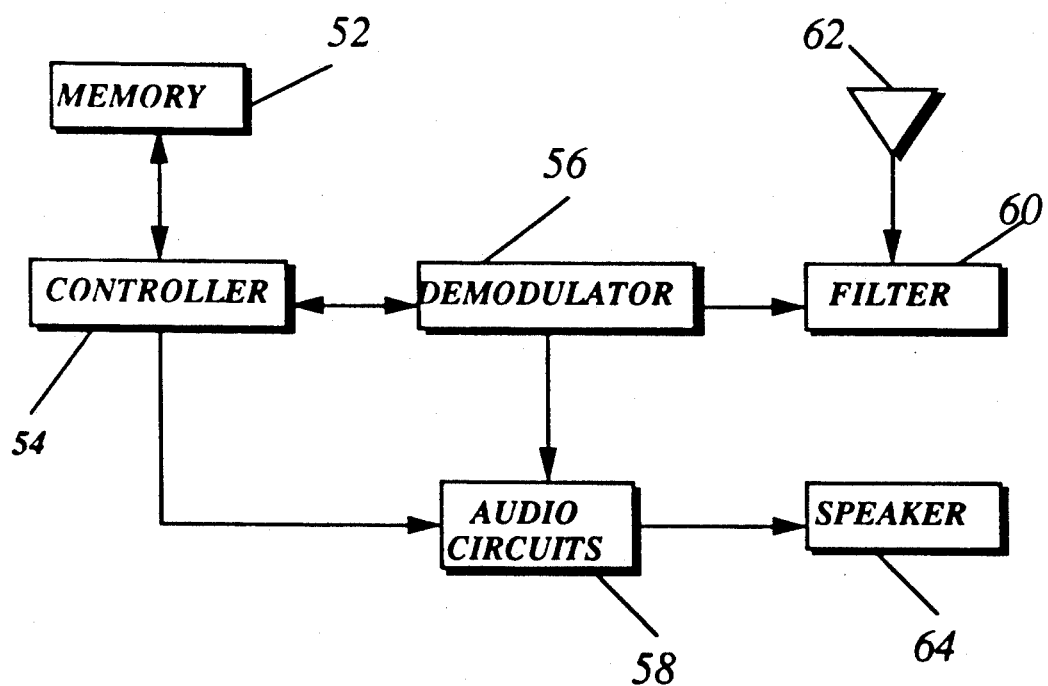
FIG. 4 is a block diagram of a communication device incorporating a voltage variable capacitor in accordance with the invention.

Applications requiring voltage variable capacitors that function at high frequencies, such as radio frequency communications equipment, will find particular use for a device as described herein. Radios utilize resonator networks or circuits that may be tuned by a voltage variable capacitor, and those operating at high frequencies realize significant advantages from a voltage variable capacitor that has low loss, high Q, and large capacitance range. Referring to FIG. 4, a block diagram of the electrical components of the radio or communication device 50 is shown. The radio 50 includes a demodulator 56 coupled to the antenna 62 via a filter(s) 60. The operation of the radio 50 is controlled by a controller 54 which includes the memory block 52. The controller 54 communicates to the demodulator 56 and controls the audio circuit block 58. The demodulated signal from the demodulator 56 is coupled to a speaker 64 via the audio circuit 58. The combination of the memory block 52, the controller 54, demodulator 56, and the filter 60 constitutes a receiver means in the communication device 50. The voltage variable capacitors as described herein will preferably find application in the filter 60, but may also be utilized in the demodulater 56 and/or the audio circuits 58.

In summary, it may be seen that favorable results from utilizing this structure are prevention of contact between the top and bottom electrodes through conducting grain boundaries and voids, reduction of non-homogeneous and field enhancing regions, lower loss, higher Q, improvement in film resistivity, improved electrical breakdown, and improved storage charge characteristics. The foregoing examples are intended to serve as an illustration of the preferred embodiment of the invention. Accordingly, it is not intended that the invention be limited except as by the appended claims herein.

What is claimed is:

1. A semiconductor device, comprising:
a semiconductor substrate having a layer of semiconductor material deposited thereon, said material having higher resistivity than the substrate;

a dielectric layer deposited on the higher resistivity layer;

an amorphous layer of dielectric material deposited on the dielectric layer; and a top electrode formed on the amorphous layer.

2. The semiconductor device as described in claim 1, wherein the semiconductor device as a voltage variable capacitor.

3. The semiconductor device as described in claim 1, wherein the high resistivity layer is an epitaxial layer.

4. The semiconductor device as described in claim 1, wherein the dielectric layer and the amorphous layer are metal oxide compounds wherein the metal comprises at least first and second components selected from the group consisting of barium, lead, lithium, neodymium, niobium, strontium, tantalum, titanium, and zirconium.

5. The semiconductor device as described in claim 1, wherein the dielectric layer and the amorphous layer are oxides selected from the group consisting of oxides of barium, lead, lithium, neodymium, niobium, strontium, tantalum, titanium, and zirconium.

6. The semiconductor device as described in claim 1, wherein the dielectric layer and the amorphous layer comprise zirconium titanate.

7. The semiconductor device as described in claim 1, wherein the dielectric constant of the dielectric layer is greater than the dielectric constant of the high resistivity semiconductor material.

8. The semiconductor device as described in claim 1, wherein the amorphous layer is between the higher resistivity layer and the dielectric layer.

9. A semiconductor device, comprising:

a semiconductor substrate having a layer of semiconductor material deposited thereon, said material having higher resistivity than the substrate;

an amorphous layer of dielectric material formed on the higher resistivity layer;

a dielectric layer deposited on the amorphous layer;

another amorphous layer of dielectric material deposited on the dielectric layer; and a top electrode formed on the amorphous layer.

10. The semiconductor device as described in claim 9, wherein the semiconductor device is a voltage variable capacitor.

11. The semiconductor device as described in claim 9, wherein the high resistivity layer is an epitaxial layer.

12. The semiconductor device as described in claim 9, wherein the dielectric layer and the amorphous layer are metal oxide compounds wherein the metal comprises at least first and second components selected from the group consisting of barium, lead, lithium, neodymium, niobium, strontium, tantalum, titanium, and zirconium.

13. The semiconductor device as described in claim 9, wherein the dielectric layer and the amorphous layer are oxides selected from the group consisting of oxides of barium, lead, lithium, neodymium, niobium, strontium, tantalum, titanium, and zirconium.

14. The semiconductor device as described in claim 9, wherein the dielectric layer and the amorphous layer comprises zirconium titanate.

15. The semiconductor device as described in claim 9, wherein the dielectric constant of the dielectric layer is greater than the dielectric constant of the high resistivity semiconductor material.

16. A semiconductor device, comprising:

a semiconductor substrate having a layer of semiconductor material deposited thereon, said material having higher resistivity than the substrate;

a first zirconium titanate layer being at least partially crystalline, deposited on the higher resistivity layer;

a second zirconium titanate layer deposited on the first layer, said second layer being amorphous;

a top electrode formed on the amorphous layer; and a depletion region formed in the higher resistivity layer upon electrically energizing the device.

17. The semiconductor device as described in claim 16, wherein the higher resistivity layer is an epitaxial layer.

18. The semiconductor device as described in claim 16, wherein the second zirconium titanate layer is between the higher resistivity layer and the first zirconium titanate layer.

19. The semiconductor device as described in claim 16, further comprising a third layer of amorphous zirconium titanate formed between the higher resistivity layer and the first zirconium titanate layer.

20. A radio having a filter and a demodulator forming a portion of a receiver, the filter having at least one voltage variable capacitor comprising:

a semiconductor substrate having a layer of semiconductor material having higher resistivity than the substrate, deposited thereon;

a dielectric layer deposited on the higher resistivity layer;

an amorphous layer of dielectric material deposited on the dielectric layer; and a metal electrode formed on the amorphous layer.

21. The radio as described in claim 20, wherein the voltage variable capacitor further comprises an amorphous layer of dielectric material formed on the higher resistivity layer.

22. A voltage variable capacitor, comprising:

a semiconductor substrate having a layer of semiconductor material deposited thereon, said material having higher resistivity than the substrate;

an insulating layer deposited on the higher resistivity layer, the insulating layer having a dielectric constant greater than the higher resistivity layer;

an amorphous layer of dielectric material deposited on the insulating layer; and a top electrode formed on the amorphous layer.

23. The voltage variable capacitor as described in claim 22, wherein the insulating layer and the amorphous layer are metal oxide compounds wherein the metal comprises at least first and second components selected from the group consisting of barium, lead, lithium, neodymium, niobium, strontium, tantalum, titanium, and zirconium.

24. The voltage variable capacitor as described in claim 22, wherein the insulating layer and the amorphous layer are oxides selected from the group consisting of oxides of barium, lead, lithium, neodymium, niobium, strontium, tantalum, titanium, and zirconium.

25. The voltage variable capacitor as described in claim 22, wherein the insulating layer and the amorphous layer comprise zirconium titanate.

* * * * *